US005631117A

United States Patent [19]

Nakajima et al.

[11] Patent Number: 5,631,117

[45] Date of Patent: May 20, 1997

[54] MANUFACTURING METHOD OF AN IMAGE FORMING MATERIAL FOR LIGHT-HEAT CONVERTING HEAT MODE RECORDING

[75] Inventors: Atsushi Nakajima; Ai Katsuda; Sota Kawakami; Shinji Kudo, all of Hino, Japan

[73] Assignee: Konica Corporation, Japan

[21] Appl. No.: 588,144

[22] Filed: Jan. 18, 1996

[30] Foreign Application Priority Data

Jan. 24, 1995 [JP] Japan .................................... 7-008994

[51] Int. Cl.$^6$ .......................... G03C 1/805; G03C 11/12; G03F 7/34

[52] U.S. Cl. .......................... 430/200; 430/256; 430/259; 430/262

[58] Field of Search .................................... 430/200, 201, 430/256, 259, 262

[56] References Cited

U.S. PATENT DOCUMENTS

| | | | |
|---|---|---|---|
| 4,594,307 | 6/1986 | Ishida | 430/259 |
| 5,232,817 | 8/1993 | Kawakami et al. | 430/201 |
| 5,300,398 | 4/1994 | Kaszczuk | 430/201 |
| 5,501,937 | 3/1996 | Matsumoto et al. | 430/200 |

*Primary Examiner*—Richard L. Schilling
*Attorney, Agent, or Firm*—Jordan B. Bierman; Bierman, Muserlian and Lucas LLP

[57] ABSTRACT

A method of manufacturing a light-heat converting heat mode recording material comprises a first support having thereon a cushion layer, an intermediate layer and an image forming layer in that order, the material comprising a light-heat converting substance, the method comprising the steps of a) providing a first unit comprising a first support; b) providing a second unit comprising a second support having thereon the image forming layer; c) superposing the second unit on the first unit so that the image forming layer is in close contact with the first unit; and d) separating the second support from the image forming layer to form the recording material, wherein the second support has a releasing layer containing a cross-linked compound on the image forming layer side, the releasing layer being insoluble in a coating solvent for both the intermediate layer and the image forming layer, and provided between the second support, or has a releasing layer containing a fluorine-containing compound or a long chain alkyl group-containing compound.

7 Claims, 5 Drawing Sheets

MANUFACTURING METHOD OF AN IMAGE FORMING MATERIAL FOR LIGHT-HEAT CONVERTING HEAT MODE RECORDING

FIELD OF THE INVENTION

The present invention relates to a method of manufacturing an image forming material provided with a flexible cushion layer for light-heat converting heat mode recording used in a light-heat converting heat mode recording method which is suitable for preparation of a highly sharp image of a transfer type, a color proof and others.

BACKGROUND OF THE INVENTION

In light-heat converting heat mode transfer, an image is obtained by transferring an image forming layer from a recording material to an image receiving material and by transferring the image forming layer from the image receiving material to a final recording medium, in which close adhesion between the recording material and the image receiving material is extremely important. When an image is highly sharp, in particular, smoothness of a sheet has a great influence. Even in the case of a color proof that reproduces halftone dots, resolving power ranging from at least several μm to ten-odd μm is required, which represents an area where unevenness of the surface of a sheet or a sheet of paper can not be disregarded.

As a means for improving close adhesion between a recording material and an image receiving material, Japanese Patent Publication Open to Public Inspection No. 22080/1994 (hereinafter referred to as Japanese Patent O.P.I Publication) discloses a technology to provide a soft or thermosoftening cushion layer between a support and an image forming layer or between a support and an image receiving layer.

In the technology mentioned above, a recording material consists of at least a support, a cushion layer, a light-heat converting layer and an image forming layer, while, an image receiving material consists of at least a support, a cushion layer, a peeling layer and an image receiving layer. In the course of light irradiation, the image forming layer peels off the light-heat converting layer at an interface between them, and is transferred onto the image receiving layer of the image receiving material. The transferred image is laminated on a final support in the following process, and the peeling layer and the image receiving layer are subjected to interfacial peeling to form a final image.

In this case, when softness of the cushion layer is sufficient, close adhesion between the recording material and the image receiving material can be secured sufficiently, which solves a problem of an image defect and makes transfer to a final support to be smooth.

In this connection, Japanese Patent O.P.I. Publication No. 127685/1994 discloses a technology wherein a cushion layer made of flexible material is provided, through solvent coating, on a support on which an intermediate layer is laminated before the support is wound.

In the method mentioned above, however, there has been a problem that a coating solvent spreads itself into a cushion layer when coating an image forming layer or an image receiving layer, and deterioration of storage stability of image forming materials is caused by a solvent residue, and surface characteristics of the image forming layer tends to be deteriorated.

In Japanese Patent Application No. 127685/1994, there is disclosed a method wherein an amount of a solvent is limited to be lower than a certain level by using a solvent having a high drying speed, for the purpose of solving the problem caused by the solvent residue. Though the solvent residue can surely be reduced in this method, a range for selecting a solvent used is narrowed. There has been a further problem that cracks are easily caused in the course of transport because of the coating wherein a soft cushion layer is a lower layer.

As a method for making a thermal transfer image receiving material of sublimation type, Japanese Patent O.P.I. Publication No. 234278/1994 discloses a method wherein a temporary support on which an image receiving layer, a dye barrier layer, and a cushion layer are laminated is stuck on a support, and then, the temporary layer is peeled off. When this method is used, the problems of solvent residue and occurrence of scratches in transportation can be solved.

However, a subject matter of the patent mentioned above is a method of making a thermal transfer image receiving material of sublimation type, and no heat adhesion characteristic is required for an image receiving layer which is a peeling surface. Therefore, even when a silicone compound which is generally known to be excellent in releasing properties is used as a releasing layer on the temporary layer, no trouble is caused. However, in the case of an image forming material for transfer of a fusion type as in the invention, silicone compounds of mold releasing agents move to the transfer surface and deteriorate transfer sensitivity strikingly.

Furthermore, in the case of an image forming material for light-heat converting heat mode recording related to the invention, interfacial peeling between an intermediate layer and an image forming layer or between an intermediate layer and an image receiving layer is required in each process. Therefore, the laminating method has another problem that an intermediate layer alone is transferred.

Namely, there has been demanded a manufacturing method employing a layer with mold releasing properties which makes it possible to transfer without having any interfacial peeling between an intermediate layer and an image forming layer or between an intermediate layer and an image receiving layer, and makes a thermal image transfer process sensitivity not to be lowered.

SUMMARY OF THE INVENTION

The invention has been attained for solving the problems mentioned above, and its object is to provide light-heat converting heat mode recording materials, or light-heat converting heat mode image receiving materials wherein uneven coating and scratches caused by transport rolls do not occur even when a soft cushion layer is present under an image receiving layer or an image forming layer, solvent residue causing cracks or creases on the surface of an outermost layer does not exist, sensitivity is not lowered, and an image forming layer can be transferred at uniform density.

Another object of the invention is to provide light-heat converting heat mode recording materials, or light-heat converting heat mode image receiving materials wherein there is neither fog nor stains, both an image forming layer and an image receiving layer have excellent peeling properties, and a thermal image transfer process is excellent.

DETAILED DESCRIPTION OF THE INVENTION

Figure 1:
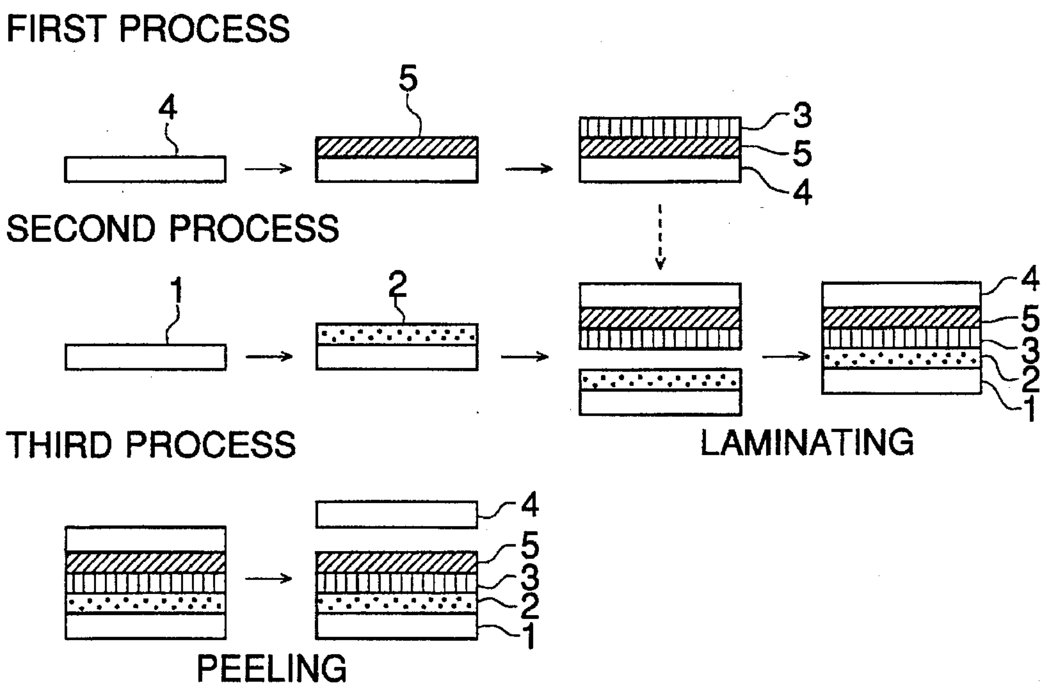
FIG. 1 shows steps of a manufacturing method 1 for recording materials of a light-heat converting heat mode of the invention.
Figure 2:
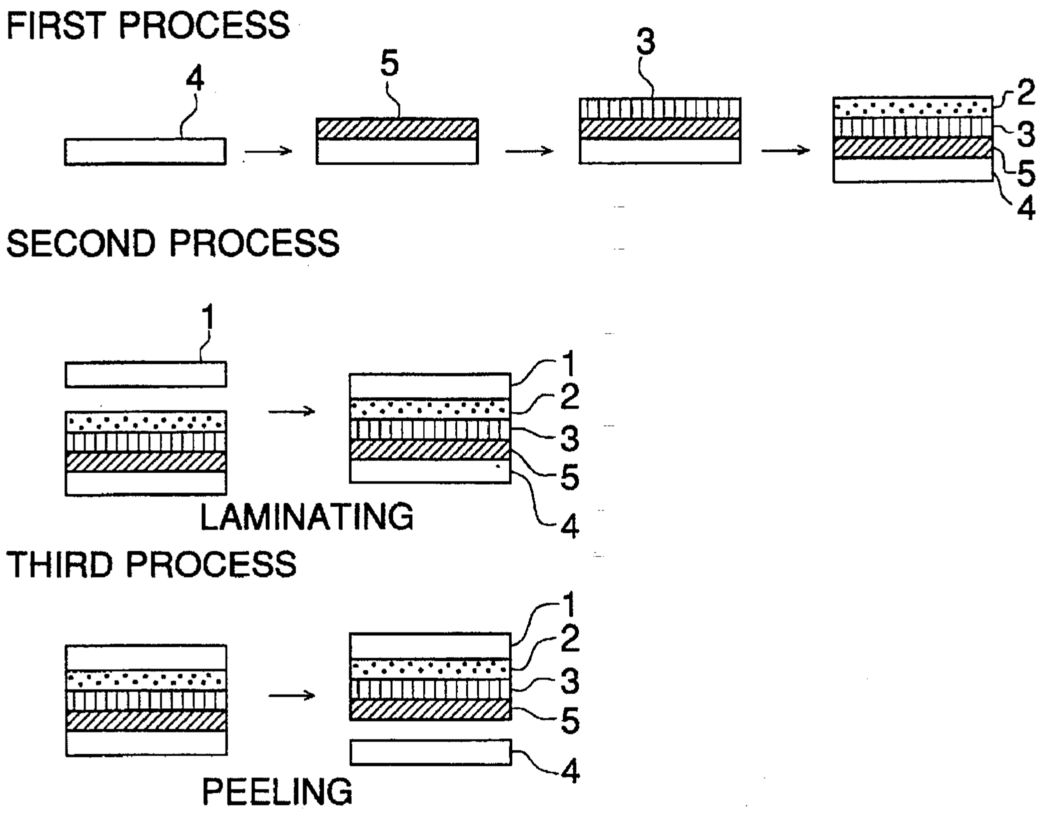
FIG. 2 shows steps of a manufacturing method 2 for recording materials of a light-heat converting heat mode of the invention.
Figure 3:
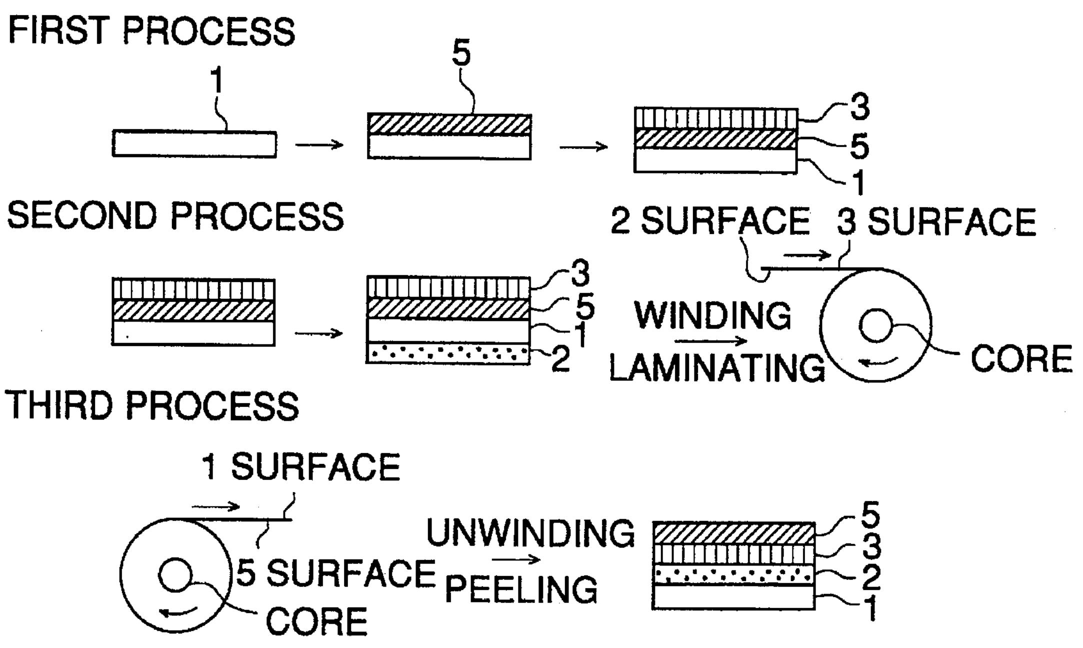
FIG. 3 shows steps of a manufacturing method 3 for recording materials of a light-heat converting heat mode of the invention.
Figure 4:
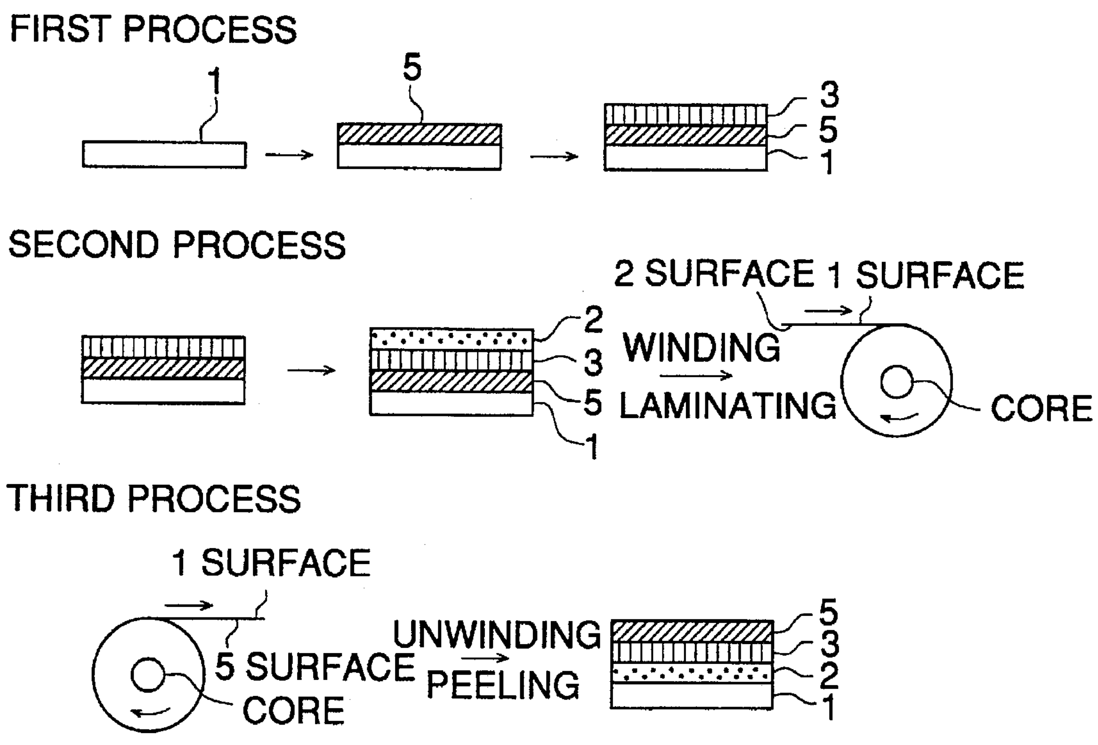
FIG. 4 shows steps of a manufacturing method 4 for recording materials of a light-heat converting heat mode of the invention.
Figure 5:
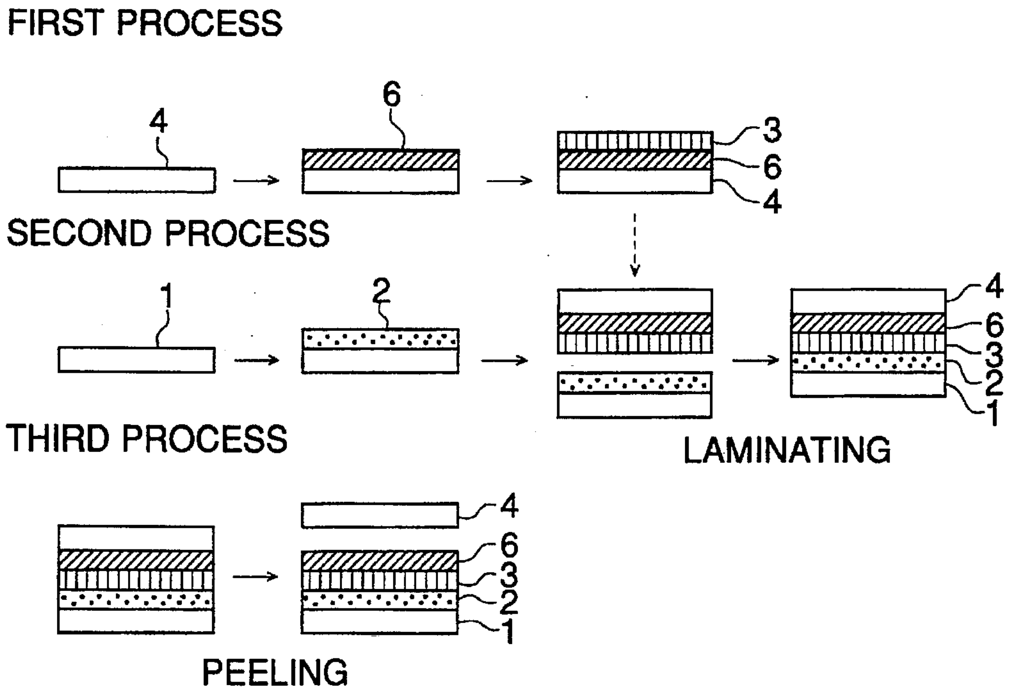
FIG. 5 shows steps of a manufacturing method 5 for image receiving materials of a light-heat converting heat mode of the invention.
Figure 6:
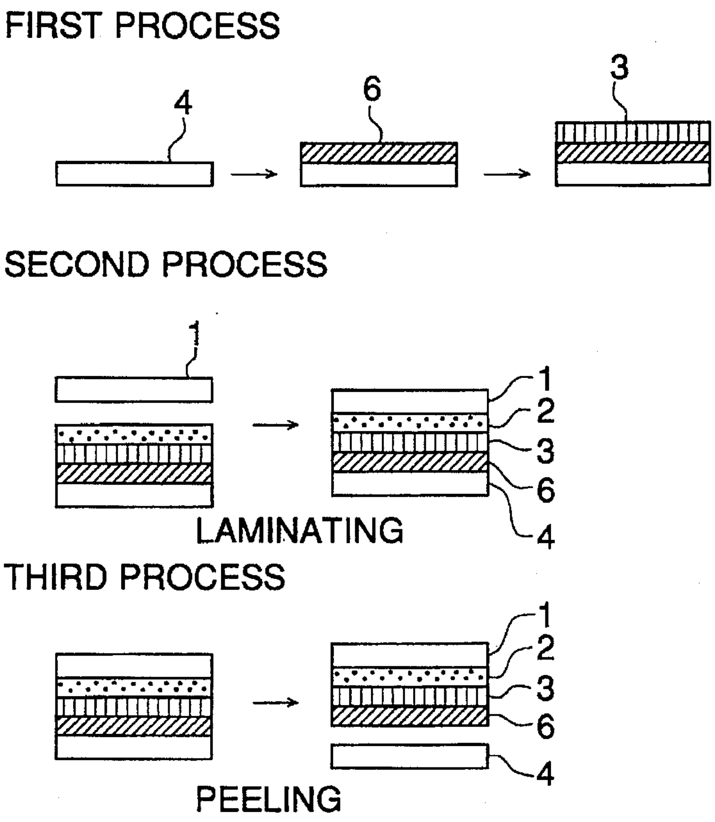
FIG. 6 shows steps of a manufacturing method 6 for image receiving materials of a light-heat converting heat mode of the invention.
Figure 7:
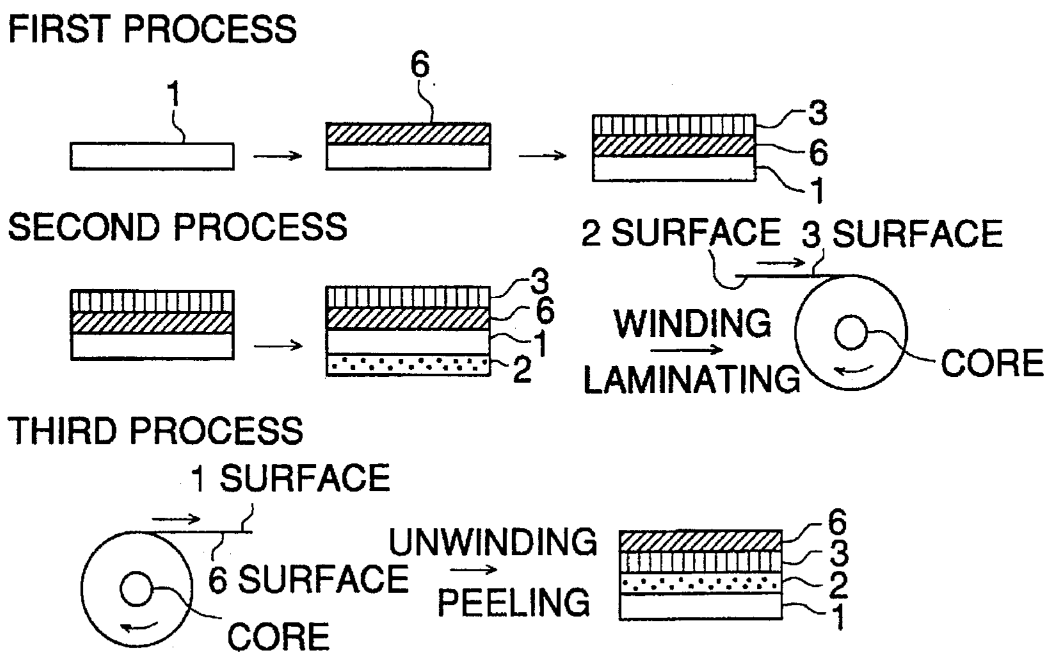
FIG. 7 shows steps of a manufacturing method 7 for image receiving materials of a light-heat converting heat mode of the invention.
Figure 8:
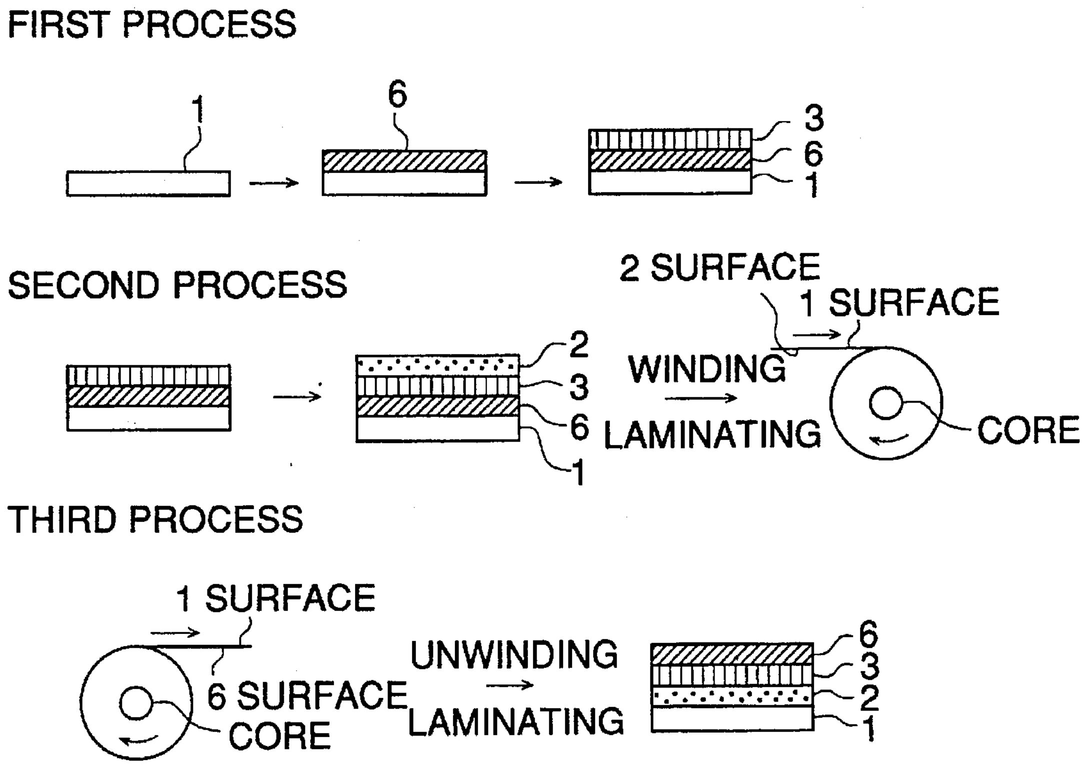
FIG. 8 shows steps of a manufacturing method 8 for image receiving materials of a light-heat converting heat mode of the invention.

The above objects of the invention have been attained by a method comprising the steps of coating, on a temporary support or a support, an image forming layer or an image receiving layer and then peeling the image forming layer or image receiving layer between the temporary support or the support and the image forming layer or image receiving layer as follows:

1. a method of manufacturing a light heat converting heat mode recording material comprising a first support and provided thereon, a cushion layer, an intermediate layer, and an image forming layer in that order, the method comprising the steps of forming the image forming layer on a temporary support having a cross-linked peeling layer on the support; and then peeling the image forming layer between the temporary support or the support and the image forming layer to form the recording material,

2. a method of manufacturing a light heat converting heat mode recording material comprising a first support and provided thereon, a cushion layer, an intermediate layer, and an image forming layer in that order, the method comprising the steps of forming the image forming layer on a temporary support having a peeling layer which is insoluble in a coating solvent of both intermediate layer and image forming layer or the support; and then peeling the image forming layer between the temporary support or the support and the image forming layer to form the recording material,

3. a method of manufacturing a light heat converting heat mode recording material comprising a first support and provided thereon, a cushion layer, an intermediate layer, and an image forming layer in that order, the method comprising the steps of forming the image forming layer on a temporary support having a peeling layer containing a fluorine-containing compound or a long chain alkyl group containing compound or the support; and then peeling the image forming layer between the temporary support or the support and the image forming layer to form the recording material,

4. a method of manufacturing a light heat converting heat mode recording material of 1, 2 or 3 above, the method comprising the steps of forming the image forming layer, the intermediate layer, a cushion layer and the support on a temporary support in that order; and then peeling the image forming layer between the temporary support and the image forming layer to form the recording material,

5. a method of manufacturing a light heat converting heat mode recording material of 1, 2 or 3 above, the method comprising the steps of forming the image forming layer, the intermediate layer, the cushion layer on the support in that order; and then peeling the image forming layer between the support and the image forming layer to transfer the peeled image forming layer together with the cushion layer and the intermediate layer to the other surface side of the support to form the recording material,

6. a method of manufacturing a light heat converting heat mode image receiving material comprising a first support and provided thereon, a cushion layer, an intermediate layer, and an image receiving layer in that order, the method comprising the steps of forming the image receiving layer on a temporary support having a cross-linked peeling layer or the support; and then peeling the image forming layer between the temporary support or the support and the image forming layer to form the image receiving material,

7. a method of manufacturing a light heat converting heat mode image receiving material comprising a first support and provided thereon, a cushion layer, an intermediate layer, and an image receiving layer in that order, the method comprising the steps of forming the image receiving layer on a temporary support having a peeling layer which is insoluble in a coating solvent of both intermediate layer and image receiving layer or the support; and then peeling the image receiving layer between the temporary support or the support and the image receiving layer to form the image receiving material,

8. a method of manufacturing a light heat converting heat mode image receiving material comprising a first support and provided thereon, a cushion layer, an intermediate layer, and an image receiving layer in that order, the method comprising the steps of forming the image receiving layer on a temporary support having a peeling layer containing a fluorine-containing compound or a long chain alkyl group containing compound or the support; and then peeling the image receiving layer between the temporary support or the support and the image receiving layer to form the image receiving material,

9. a method of manufacturing a light heat converting heat mode image receiving material of 6, 7 or 8 above, the method comprising the steps of forming the image receiving layer, the intermediate layer, the cushion layer and the support on a temporary support in that order; and then peeling the image receiving layer between the temporary support and the image receiving layer to form the image receiving material,

10. a method of manufacturing a light heat converting heat mode recording material of 6, 7 or 8 above, the method comprising the steps of forming the image receiving layer, the intermediate layer, the cushion layer on the support in that order; and then peeling the image receiving layer between the support and the image receiving layer to transfer the peeled image receiving layer together with the cushion layer and the intermediate layer to the other surface side of the support to form the image receiving material, 11. a method of manufacturing a light heat converting heat mode recording material comprising a first support and provided thereon, an elastic cushion layer, a light-heat converting layer, and an image forming layer in that order, the light-heat converting layer comprising a light-heat converting substance and a binder, the method comprising the steps of:
 forming the image forming layer, the light-heat converting layer, the elastic cushion layer, and the first support in that order on a second temporary support; and then
 separating the image forming layer from the second temporary support to form the recording material, or 12. a method of manufacturing a light heat converting heat mode recording material comprising a support and provided thereon, an elastic cushion layer, a light-heat converting layer, and an image forming layer in that order, the light-heat converting layer comprising a light-heat converting substance, the method comprising the steps of:
 a) forming the image forming layer, the light-heat converting layer, the elastic cushion layer on one side of the support in that order;
 b) separating the elastic cushion layer, the light-heat converting layer, and the image forming layer altogether from the one side of the support, and then
 c) transferring the elastic cushion layer, the light-heat converting layer and the image forming layer to the opposite side of the support to form the recording material.

The invention will be explained in detail as follows.

In a light-heat converting heat mode recording method employing image forming materials of the invention, a recording material is superposed on an image receiving layer so that the surface at an image forming layer on the recording material faces the surface at an image receiving layer on the image receiving material, and both of them are subjected to imagewise exposure heating, and thereby the image forming layer is transferred onto the surface of the image receiving layer. The final layer structure of an image forming material to be used includes the following variations ([] indicates an intermediate layer to be formed on a cushion layer).

(Recording material)

Support/cushion layer/[light-heat converting layer]/image forming layer

Support/cushion layer/[peeling layer]/image forming layer←to obtain ink peeling property Support/cushion layer/[adhesion layer]/[light-heat converting layer]/image forming layer←to prevent layer peeling on a light-heat converting layer (Image receiving layer)

Support/cushion layer/[peeling layer]/image receiving layer←to retransfer a first transfer image together with an image receiving layer Support/cushion layer/[adhesion layer]/image receiving layer←to retransfer only the first transfer image In the final structure for the material made in the invention, there is provided at least one intermediate layer between a cushion layer and an image forming layer or between a cushion layer and an image receiving layer.

The intermediate layer herein referred to is a layer on a support provided between a cushion layer and an image receiving layer or an image forming layer. The intermediate layer is provided in the above described constitution, and includes a peeling layer or an adhesion layer in an image receiving layer, and includes a light-heat converting layer, a peeling layer or an adhesion layer in an image forming layer.

The image forming layer comprises a binder and a colorant. The colorant includes inorganic pigments such as titanium dioxide, carbon black, graphite, zinc oxide, Prussian blue, cadmium sulfide, iron oxides and a chromate of lead, zinc, barium or carcium; organic pigments such as pigments of the azo, thioindigo, anthraquinone, anthanthrone and triphenedioxazine type, vat dye pigment, phthalocyanione pigment or its derivative, and quinacridone pigment; and dyes such as acid dyes, direct dyes, dispersion dyes, oil-soluble dyes, metal-containing oil-soluble dyes and sublimation dyes. The colorant content of the image forming layer is not specifically limited, but is preferably 5 to 70 weight %, and more preferably 10 to 60 weight %. The yellow colorant is preferably C.I. No. 21095 or C.I. No. 21090. The magenta colorant is preferably C.I. No. 5850:1. The cyan colorant is preferably C.I. No. 74160.

The binder includes a heat fusible compound, a heat softening compound and a thermoplastic resin. The heat fusible compound is a solid or half-solid substance having a melting point of 40° to 150° C. The melting point is measured by a melting point apparatus MJP-2 produced by Yanagimoto Co. The heat fusible compound includes carnauba wax, paraffin wax, microcrystal wax, polyethylene wax and ester wax. The thermoplastic resin includes an ethylene copolymer, a polystyrene resin, a polyamide resin, a polyester resin, a polyurethane resin, a polyolefin resin, an acryl resin, a vinylchloride resin, a cellulose resin, a rosin resin, a polyvinyl alcohol resin, a polyvinyl acetal resin, an ionomer resin, a petroleum resin; an elastomer such as natural rubber, styrene-butadiene rubber, isoprene rubber, chloroprene rubber or a diene copolymer; a rosin derivative such as ester gumm, a rosin-maleic acid resin, a rosin-phenol resin or a hydrogenated rosin resin; and a polimeric compound such as a phenol resin, a terpene resin, a cyclopentadiene resin or an aromatic hydrocarbon resin. Of these, the styrene-acryl copolymer is preferable in view of thermal transferring property or color reproduction. The image forming layer composition is dissolved or dispersed in solvents, ketones such as methylethyl ketone and cyclohexanone, aromatic solvents such as toluene and xylene, an ester solvent such as ethyl acetate, alcohols such as isopropyl alcohol and methyl alcohol and water. The resulting solution or dispersion is coated on a support to obtain an image forming layer. The solvent is preferable which does not dissolve a light heat converting layer in view of excellent transfer of the image forming layer. The thickness of the image forming layer is preferably 0.2 to 2 μm, and more preferably 0.3 to 1.5 μm.

The light-heat converting layer comprises a light-heat converting substance and a binder, in which the compounds disclosed in Japanese Patent O.P.I. Publication Nos. 5-286257/1993 and 5-338358/1993 are used.

The light-heat converting substance includes an inorganic compound such as carbon black, graphite or colloid silver having a 400 to 1000 nm grain size, an organic compound such as a cyanine, polymethine, azulenium, squalenium, thiopyrylium, naphthoquinone or anthraquinone dye, and an organic metal complex of phthalocyanine, azo or thioamide type.

As the binder, resins having Tg higher than that of resins used in an image forming layer and high heat conductivity are used. The binder includes resins such as polymethylmethacrylate, polycarbonate, polystyrene, ethylcellulose, nitrocellulose, polyvinylalcohol, polyvinyl chloride, polyamide, polyimide, polyetherimide, polysulfone, polyethersulfone, and aramide. A water soluble binder is preferable because it has relatively high heat resistance, restrains scattering or abrasion of the light-heat converting layer when excessive heat is applied, gives excellent peelability between the image forming layer and the light-heat converting layer and is more soluble compared to the heat resistant engineering plastics.

The binder content of the light-heat converting substance is preferably 10 to 90 weight %, and more preferably 20 to 80 weight %.

Of the water soluble binders is preferable in view of high heat resistance polyvinyl alcohol having low impurity, a polymerization degree of not less than 1000 and a saponification degree of not less than 80%, polyvinyl acetal or ethylcellulose. When the water soluble binder is used, it is preferable that the light-heat converting substance is water soluble or dispersable in water. The water soluble light-heat converting substance has an acid residue such as a sulfo, carboxyl, or phosphono group or a group containing a sulfonamide or carboamide group, and preferably has a sulfo group.

A surface active agent may be added in order to improve coatability. The light-heat converting layer may contain a substance to increase adhesion between the converting layer and its lower layer or a substance to increase peelability between the converting layer and its upper ink layer. When the water soluble colorant or a binder is dissolved in the coating solvent, heat or shearing may be applied to promote solubility.

The light-heat converting layer ordinarily contains a light-heat converting substance in an amount of 2 to 80 weight %, and preferably 20 to 70 weight %. The light-heat converting substance may be added to other layers.

The preferable thickness of the light-heat converting layer is ordinarily 0.1 to 3 μm, and preferably 0.2 to 1 μm. The thickness is preferably thinner in view of less heat diffusion, so long as most of light is converted to heat in the light-heat converting layer and the image forming layer. The optical density in the recording light wavelength is 0.3 to 3.0, and preferably 0.3 to 1.0.

As the peeling layer silicone resins, wax, or hardenable isocyanate resins are used besides the resins used in the above light-heat converting layer. The acryl resins are used as the adhesion layer. As the image receiving layer vinylchloride resins, polyvinyl acetal resins, styrene resins, acryl resins, ethylene-vinylacetate copolymer resins or ionomers are used.

It is preferable that the intermediate layer is excellent in view of handling properties or transportability. The resins used in the intermediate layer (concretely, a peeling layer or an adhesion layer in a recording material and a peeling layer or an adhesion layer in an image receiving material) are selected from non-tacky resins. For example, the resins include resins having a Tg of not less than 50° C. The thickness of the intermediate layer is not limited, but preferably 0.1 to 3 μm.

The conditions in which an image receiving layer and an intermediate layer have satisfactory peelability are detailed in Japanese Patent O.P.I. Publication Nos. 5-286257/1993 and 5-338358/1993. That is, when a water soluble binder is used in an intermediate layer, a water insoluble binder is used in an image forming layer, and when a water insoluble binder is used in an intermediate layer, a water soluble binder or a water dispersible binder is used in the image forming layer.

In the invention the cushion layer preferably has the following properties.

Concretely, resins are used which are extremely flexible (for example, have a coefficient of elasticity of not more than 100 kg/cm$^2$ and a penetration of not less than 20) and have a tackiness at room temperature. Generally, the resins having a tackiness at room temperature are preferably resins having a Tg of not more than 20° C., and include SBR, EVA, SIS, SEBS, and polybutadiene. The low elastic resins, rubber-elastic resins, or thermoplastic resins which soften by applying heat to improve adhesion can be used. These resins include natural rubber, acrylate rubber, butyl rubber, nitrile rubber, butadiene rubber, isoprene rubber, styrene-butadiene rubber, chloroprene rubber, urethane rubber, silicone rubber, acryl rubber, fluorine rubber, neoprene rubber, chlorosulfonated polyethylene, epichlorohydrin, EPDM (ethylene-propyrene-diene rubber), urethane elastomers, polyethylene, polypropylene, polybutadiene, polybutene, impact resistant ABS resins, polyurethane, ABS resins, cellulose acetates, amide resins, polytetrafluoroethylene, nitrocelluloses, polystyrene, epoxy resins, phenolformaldehyde resins, polyesters, impact resistant acryl resins, styrene-butadiene copolymer, ethylene-vinylacetate copolymer, acrylonitrile-butadiene copolymer, vinylchloride-vinylacetate copolymer, polyvinylacetate, polyvinylchloride resin containing a plasticizer, vinylidenechloride resins, polyvinylchloride, and polyvinylidenechloride. Of these resins the low elastic resins are used.

Further, for securing sufficient close adhesion, it is preferable that a thickness of a cushion layer is 2 μm or more and it is more preferable that it is 5 μm or more. Though there is no upper limit for the thickness of a cushion layer in particular, a range of 40–50 μm is the upper limit because an excessive thickness of a layer leads to load and cost increase in manufacturing.

It is further preferable that a total thickness of a cushion layer of a recording material and that of an image receiving layer is 30 μm or more.

Embodiments of preferable manufacturing methods for recording materials of the invention are shown in the following manufacturing methods 1–4.

<Manufacturing method 1>

A manufacturing method consisting of a first step for laminating an image forming layer and an intermediate layer in this order on a temporary support, a second step for forming a cushion layer on a support and for laminating the cushion layer formed on the support and the intermediate layer laminated on the temporary support in the first step so that both layers face each other, and a third step for peeling the temporary support at an interface between the image forming layer and the temporary support.

<Manufacturing method 2>

A manufacturing method consisting of a first step for laminating an image forming layer and an intermediate layer in this order on a temporary support, a second step for forming a cushion layer on the intermediate layer and for laminating the cushion layer and the support, and a third step for peeling the temporary support at an interface between the image forming layer and the temporary support.

<Manufacturing method 3>

A manufacturing method consisting of a first step for laminating an image forming layer and an intermediate layer in this order on the surface on one side of a support, a second step for forming a cushion layer on the other side of the support and for winding it in a roll shape, and a third step for peeling at an interface between the support and the image forming layer in the course of unwinding and for transferring the image forming layer and the intermediate layer onto the cushion layer on the other side of the support.

<Manufacturing method 4>

A manufacturing method consisting of a first step for laminating an image forming layer and an intermediate layer in this order on the surface on one side of a support, a second step for forming a cushion layer on the intermediate layer and for winding it in a roll shape, and a third step for peeling at an interface between the surface on one side of the support and the image forming layer in the course of unwinding and for transferring the image forming layer, the intermediate layer and the cushion layer onto the surface on the other side of the support.

Embodiments of the aforementioned preferable manufacturing methods in the invention are shown in FIGS. 1–4.

In FIGS. 1–4, the numeral 1 represents a support, 2 represents a cushion layer, 3 represents an intermediate layer, 4 represents a temporary layer and 5 represents an image forming layer.

Next, embodiments of preferable manufacturing methods for image receiving materials of the invention include the following manufacturing methods 5–8.

<Manufacturing method 5>

A manufacturing method consisting of a first step for laminating an image receiving layer and an intermediate layer in this order on a temporary support, a second step for forming a cushion layer on a support and for laminating the intermediate layer formed on the support and the intermediate layer laminated on the temporary support in the first step so that both layers face each other, and a third step for peeling the temporary support at an interface between the image receiving layer and the temporary support.

<Manufacturing method 6>

A manufacturing method consisting of a first step for laminating an image receiving layer and an intermediate layer in this order on a temporary support, a second step for forming a cushion layer on the intermediate layer and for laminating the cushion layer and the support, and a third step for peeling the temporary support at an interface between the image receiving layer and the temporary support.

<Manufacturing method 7>

A manufacturing method consisting of a first step for laminating an image receiving layer and an intermediate layer in this order on the surface on one side of a support, a second step for forming a cushion layer on the other side of the support and for winding it in a roll shape, and a third step for peeling at an interface between the support and the image receiving layer in the course of unwinding and for transferring the image receiving layer and the intermediate layer onto the cushion layer on the other side of the support.

<Manufacturing method 8>

A manufacturing method consisting of a first step for laminating an image receiving layer and an intermediate layer in this order on the surface on one side of a support, a second step for forming a cushion layer on the intermediate layer and for winding it in a roll shape, and a third step for peeling at an interface between the surface on one side of the support and the image receiving layer in the course of unwinding and for transferring the image receiving layer, the intermediate layer and the cushion layer onto the surface on the other side of the support.

Embodiments of the aforementioned preferable manufacturing methods in the invention are shown in FIGS. 5–8.

In FIGS. 5–8, the numeral 11 represents a support, 2 represents a cushion layer, 3 represents an intermediate layer, 14 represents a temporary support and 6 represents an image receiving layer.

In the layer structure of materials formed in the invention, it is preferable that peeling force F1 at an interface between a temporary support or a support and the image receiving layer or the image forming layer is smaller than peeling force F2 between the image receiving layer or the image forming layer and an intermediate layer, and that F2 is smaller than peeling force F3 between the intermediate layer and the cushion layer. In particular, it is preferable that peeling force at an interface between the temporary support and the image receiving layer or between the temporary support and the image forming layer is 10 g/cm or less.

However, peeling force F2 at an interface between the image receiving layer or the image forming layer and the intermediate layer needs to be set small from the viewpoint of transferability. Incidentally, it is preferable that F2 between the image forming layer and the intermediate layer is smaller than F2 between the image receiving layer and the intermediate layer.

F2 is preferably not more than 300 g/cm. Namely, peeling force between the image receiving layer and the intermediate layer or between the image forming layer and the intermediate layer is small originally, and when peeling the back side of a temporary support or of a support, it sometimes happens that the image receiving layer or the image forming layer remains on the back side of the temporary support or the support.

Figure 9:
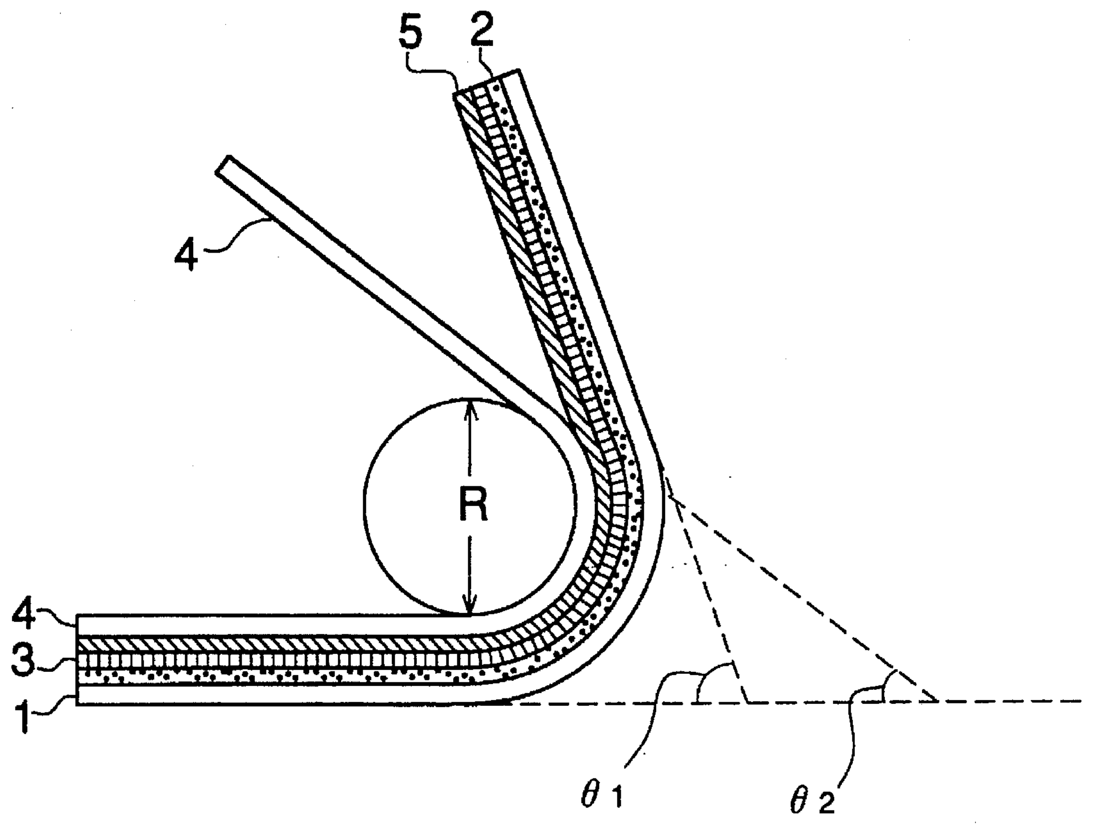
FIG. 9 shows a cross-sectional view of a preferable state of peeling employing a peeling roll in a manufacturing method of the invention.

To avoid phenomena mentioned above, peeling on a peeling roll is preferable when a temporary support is used. In the case of peeling on a peeling roll, it is preferable that a temporary support is located to be inside, and further, a curvature is given also to a support on the peeling roll. Curvature $\theta_1$ of the temporary support that is 180° or less is preferable and those representing 110° are more preferable. It is preferable that Curvature $\theta_2$ of the support is smaller than $\theta_1$.(See FIG. 9).

A diameter of a peeling roll which is not more than 50 mmϕ is preferable and that not more than 20 mmϕ is more preferable. Through this method, it is possible to transfer an image forming layer or an image receiving layer stably.

When no temporary support is used, it is preferable that an image forming surface or an image receiving surface is located to be inside for winding in preparation, and peeling is performed by unwinding the same.

Incidentally, when making a roll as a final form, or even when cutting into a sheet as a final form, it is preferable that a temporary support is peeled immediately before roll winding or cutting into a sheet, for the purpose of avoiding that scratches are caused or dust sticks on an image receiving layer or an image forming layer after peeling the temporary support, and it is preferable that an image receiving layer and an image forming layer do not come into contact with a roll at least after slitting.

Any film can be used as the temporary support or the support in the invention as long as it has rigidity, excellent dimensional stability and heat resistance in forming an image. The film includes a plastic film such as polyethyleneterephthalate, polyethylenenaphthalate, polycarbonate, nylon, polyvinylchloride, polystyrene, polymethylmethacrylate or polypropylene. When a laser beam is irradiated from a recording material side to form an image, the support of the recording material is preferably transparent. When a laser beam is irradiated from the image receiving material side to form an image, the support of the recording material does not need to be transparent. The thickness of the support in the invention is preferably 6 to 200 μm, and more preferably 25 to 100 μm.

One side of the support in the invention or the temporary support in the invention needs to be coated with an image receiving layer or an image forming layer without repellency spot or uneven density, and one side of the support or the temporary support needs to be separated easily from an image receiving layer or an image forming layer at an interface between one side of the support or the temporary support and the image receiving layer or the image forming layer. Therefore, it is preferable that one side of the support or the temporary support is selected so that its force of adhering to an image receiving layer or an image forming layer is small, or a releasing layer is provided between the temporary support and the image receiving layer or between the temporary support and the image forming layer.

In the invention, a releasing layer is formed on one side of a support or on another temporary support. The releasing layer is a layer consisting of cross-linked polymer, a layer which is insoluble in a coating solvent of both intermediate layer and image forming layer, or a layer comprising a fluorine-containing compound or a long chained alkyl group containing compound. The long chained alkyl group includes liquid paraffin or an alkyl benzene wherein the alkyl is a straight-chained alkyl having 10 to 13 carbon atoms. The content of the fluorine-containing compound or long chained alkyl group containing compound in the releasing layer is preferably 0.10 to 20 weight %, and more preferably 0.50 to 10 weight %. When the above releasing layer is employed, an image forming layer or image receiving layer and an intermediate layer laminated on the support or the temporary support can be easily separated from the support or the temporary support, and sensitivity does not deteriorate in a thermal image transfer process.

Though the releasing layer may contain cross-linked substances in a wide range including thermosetting and ultraviolet-hardening compounds, non-silicone compounds are preferable when a sensitivity fall after the separating is considered. However, there also are exceptions such as higher fatty acid ester-modified silicon and polyester-modified silicon which do not drop a thermal image transfer process sensitivity.

From a viewpoint of exfoliation, in an image forming layer or an image receiving layer each being soluble in a solvent, cross-linked substances containing water-soluble binders (namely, binders having a hydroxyl group, a carboxyl group, or an ammonium group) and cross-linking agents such as melamine compounds, isocyanate compounds, or glyoxal derivatives are preferably used. In addition, phosphazene resin is also preferable.

With regard to cross-linking methods and compounds, there are detailed descriptions in "Handbook of Cross-linking Agents" written by Shinzo Yamashita and Tosuke Kaneko (published by Taisei Co.).

A method of making a layer wherein sparingly soluble compounds are dispersed by an appropriate solvent to be coated and then heat treatment is used for making a layer is preferable for releasing layers of a non-soluble type.

As the sparingly soluble compounds are suitable olefins such as polyethylene, polypropylene, copolymers of ethylene or propylene with other monomers, for example, vinylacetate, ethylacrylate and acrylic acid, or fluorinated polyolefins.

The cross-linked releasing layer or non-soluble releasing layer preferably contains a fluorine-containing compound or a long chained alkyl compound to improve separability. The examples include a dispersion of perfluorophosphoric esters or fluorinated polyolefins. For example, Sumirez resin FP-150 produced by Sumitomo Kagaku Co. Ltd., the PTFE-L series produced by Daikin Co. Ltd., the Fluon series produced by Asahi Garasu Co. Ltd., and the Fluorad series produced by 3M Co. Ltd. are available on the market.

The fluorine-containing compound and long chained alkyl compound are preferable since they do not lower fusible transfer sensitivity, and as well improve separability between the image receiving layer or the image forming layer and the peeling layer. Further, the fluorine-containing compound prevents undesirable transfer of fog or stains.

When laminating an image forming layer, a light-heat converting layer and an image receiving layer on the releasing layer, the releasing layer is required to be resistant against solvents used for coating the aforesaid layers. "To be resistant against solvents" in this case means that the releasing layer is free from a phenomenon wherein it dissolves in solvents, it swells, and degenerates, resulting in a remarkable rise in separation force between the releasing layer and the image forming layer or between the releasing layer and the image receiving layer, or resulting in inability to separate between the layers. Therefore, the releasing layer is required to be hardened or to be non-soluble in solvents used for lamination. Further, it is also possible to use a hydrophilic binder having small force of adhering to an image receiving layer and an image forming layer (PVA, gelatin, butyral, etc.).

The releasing layer is made in a method which is normally used widely, such as an in-line coating method or an off-line coating method. A layer thickness of the releasing layer takes various values depending on manufacturing methods, but values of 0.01–5 μm are preferable. When the releasing layer contains matting agents, the thickness of the releasing layer needs to be one which does not have influence on the effects of the matting agents.

It is preferable to apply a sufficient pressure when laminating a cushion layer on an intermediate layer which is laminated on an image receiving layer or an image forming layer, and its value of 5 g/cm or more is desirable. The temperature for laminating varies depending on characteristics of a material of a cushion, and its preferable value ranges from a room temperature to 120° C. When laminating layers by the use of a metallic roll, the smooth roll surface is preferable.

With regard to smoothness of a roll, it is preferable that average value $R_a$ representing the surface smoothness is 0.01–3 μm. When using a rubber roll, its rubber hardness is preferably 40°–100°.

Since an image forming layer of a heat mode recording material and the surface of an image receiving layer of a heat mode image receiving material both obtained through a method of the invention are in contact with a temporary support or with a support, the surface of the image receiving layer and the image forming surface are mirror-finished as they are. Therefore, when they are stored in the form of a roll or in the laminated condition, the laminated surfaces show a blocking phenomenon, or when the surface of the image receiving layer and the image forming surface are brought into contact to face each other and are heated for imagewise exposure, portion other than imagewise-exposed areas sometimes are also transferred.

As a means for avoiding this problem, roughening of the surface of the image receiving layer or the image forming layer is given. In a method for roughening the surface of the image receiving layer or the image forming layer, an image receiving layer or an image forming layer is coated on a roughened temporary support or on a roughened support, and the image receiving layer or the image forming layer is peeled finally from the roughened temporary support or from the roughened support, thus, a roughened image receiving layer or a roughened image forming layer can be obtained.

Or, it is possible to roughen an image receiving layer or an image forming layer, and to prevent blocking in storage through a method wherein an image receiving layer or an image forming layer and an intermediate layer are first laminated in this order on a temporary support, then, a cushion layer and a support on which an area where the cushion layer is not formed is roughened are laminated on the cushion layer, and the temporary support is peeled at an interface with the image receiving layer or the image forming layer, to be wound up in a roll shape.

As a roughened support or a roughened temporary support, it is possible to use those containing matting agents, those subjected to embossing finish to be roughened or those subjected to cutting by minute protrusions to be roughened. As a matting agent an organic or inorganic matting agent is used. The organic matting agent includes resin particles such as fluorine-containing resin particles, guanamine resin particles, acryl resin particles, styrene-acryl copolymer resin particles, silicone resin particles, melamine resin particles, and epoxy resin particles. The inorganic matting agent includes metal oxides (silica, zinc oxide, alumina or titanium oxide), silicates (calcium silicate), sulfate (barium sulfate) and carbonate (calcium carbonate).

A particle size of matting agents and content thereof are selected depending on a layer thickness of a temporary support, and the preferable is 0.1–30 μm in particle size and 1–1000 pcs./$mm^2$ in content.

For embossing finish, a machine used normally for processing paper, leather or plastics is enough.

As minute protrusions for cutting the surface, it is possible to use a sandpaper or to use processing by means of a sand blasting method.

Further, as a means for roughening a peeling layer, a means of using two or more kinds of resins having no compatibility and making them to be cloudy for roughening is also effective.

With regard to constitution and materials of recording materials and image receiving materials, it is possible to apply technologies described in Japanese Patent O.P.I. Publication Nos. 278198/1993, 286257/1993, 318952/1993, 338358/1993 and 55867/1994.

EXAMPLES

The invention will be explained in detail as follows referring to the examples to which the embodiments of the invention are not limited.

Example 1a (Preparation of recording material)

First, a temporary support was prepared in a method wherein a releasing layer solution having the following composition was diluted with methyl ethyl ketone, then, it was coated by means of a wire bar method on a 25-μm-thick polyethylene terephthalate sheet (PET, made by Diafoil Hoechst Co.: T-100) so that a dry coating thickness is 2 μm, and it was subjected to irradiation of ultraviolet rays to be hardened.

This releasing layer is solvent-resistant to a solvent which is used for coating the following image forming layer, such as methyl ethyl ketone, cyclohexanon, water, ethanol or i-propanol.

| Releasing layer | |
|---|---|
| Phosphazene hardenable resin (Idemitsu Oil Chemistry Co.: U-2000) | 97 parts |
| Matting agent (Silicone resin particle having a particle size of 4.5 μm, Toshiba Silicone: TOSPEARL 145) | 3 parts |

On this releasing layer, an image forming layer having the following composition was wire-bar-coated. The solvent composition of methyl ethyl ketone/cyclohexanone=8/2 was used.

| Image forming layer | |
|---|---|
| [Yellow (setting a layer thickness to obtain blue transmission density of 0.79)] | |
| Yellow pigment (Benzidine Yellow, C.I. 21090) | 40 parts |
| Styrene-acrylic resin (made by Sanyo Kasei: SBM 100) | 48 parts |
| Ethylene-vinyl acetate copolymer (EVA, made by Mitsui DuPont Chemical: EV-40Y) | 5 parts |
| Dioctylphthalate | 3 parts |
| Surfactant (Asahi Glass: S-382) | 1 part |
| [Magenta (setting a layer thickness to obtain green transmission density of 0.96)] | |
| Magenta pigment (Brilliant Carmine 6B, C.I. 15850:1) | 40 parts |
| Styrene-acrylic resin (the same as above: SBM 100) | 48 parts |
| Ethylene-vinyl acetate copolymer (the same as above: EV-40Y) | 5 parts |
| Dioctylphthalate | 3 parts |
| Surfactant (the same as above: S-382) | 1 part |
| [Cyan (setting a layer thickness to obtain red transmission density of 0.83)] | |
| Cyan pigment (Phthalocyanine Blue, C.I. 74160) | 40 parts |
| Styrene-acrylic resin (the same as above: SBM 100) | 48 parts |
| Ethylene-vinyl acetate copolymer (the same as above: EV-40Y) | 5 parts |
| Surfactant (the same as above: S-382) | 1 part |
| [Black (setting a layer thickness to obtain orange transmission density of 1.28)] | |
| Black pigment (Carbon Black) | 40 parts |
| Styrene-acrylic resin (the same as above: SBM 100) | 48 parts |
| Ethylene-vinyl acetate copolymer (the same as above: EV-40Y) | 5 parts |
| Surfactant (the same as above: S-382) | 1 part |

Further, a light-heat converting layer solution having the following composition was coated on the aforementioned image forming layer through a wire bar method so that transmission density for 830 nm light is 1.0.

| Light-heat converting layer | |
|---|---|
| IR absorption dye (IR-1) | 30 parts |
| Gelatin | 67 parts |
| Surfactant (SU-1) | 2 parts |
| Water | 2500 parts |
| Ethanol | 200 parts |

Su-1: i-amyl.desyl.sodium sulfosuccinate

-continued

| Light-heat converting layer |
|---|

IR-1

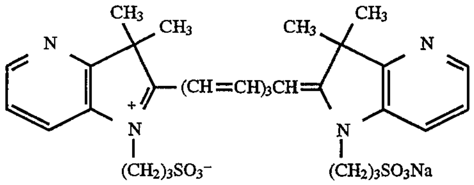

Next, a cushion layer having the following composition was coated on PET (the same as above: T-100, 100-μm-thick) through a blade coater so that a dry coating thickness is 6 μm. The aforesaid cushion layer was caused to face the light-heat converting layer prepared previously in a device shown in FIG. 2, and both layers were caused to pass through a boundary between a heat roll and a silicone roll (50° C·10 g/cm) to be laminated (manufacturing process of the invention).

| Composition of cushion layer | |
|---|---|
| Styrene-ethylene-butylene-styrene copolymer (SEBS, made by Shell: Kraton G1657) | 7 parts |
| Tackifiers (made by Arakawa Kagaku: Super Ester A100) | 3 parts |
| Toluene | 90 parts |

After laminating, the image forming layer was separated from the temporary support at their interface, and thereby, a sheet composed of PET, a cushion layer, a light-heat converting layer and an image forming layer was obtained. In this case, it was possible to separate satisfactorily, and the surface of the image forming layer was roughened by matting agents in the releasing layer. No scratch was observed on the recording material thus obtained.

Incidentally, in the example, peeling was conducted under the aforesaid desirable separation conditions.

(Preparation of image receiving material)

On a 125-μm-thick PET base (made by Diafoil Hoechst Co.: W400), there was formed a cushion layer by coating EVA (the same as above: EV-40Y), so that a dry coating thickness is 15 μm. An image receiving layer having the following composition was wire-bar-coated on the same temporary support as in the recording material, and methyl cellulose (made by Shin-etsu Kagaku: SM15) was coated to form a releasing layer on the image receiving layer so that a dry coating thickness is 0.8 μm. Thus, an image receiving material composed of a cushion layer, a releasing layer and an image receiving layer was obtained.

In this case, it was possible to peel satisfactorily, and the image receiving material was excellent being free from deterioration of the surface of the image receiving layer caused by residual solvents.

| Image receiving layer | |
|---|---|
| Acrylic resin (made by Mitsubishi Rayon: BR-113) | 98.5 parts |
| Silicone resin (the same as above: 130) | 1.5 parts |

An image receiving layer was coated in a way to get a thickness of dried coating of 1.5 μm, and solvent composition was made to be methyl ethyl ketone/cyclohexanone/i-propylalcohol=3.5/3.5/3.

The recording material and the image receiving material both prepared in the aforesaid manner were subjected to vacuum close contact (reduced from atmospheric pressure by 200 mm Hg) on a cylindrical drum in the order of the image receiving material and the recording material, and a laser diode having an oscillation wave length of 830 nm was used for transfer. The transfer was conducted under the conditions of light intensity at exposure surface of 33 mW, beam diameter in terms of $1/e^2$ of 11 μm and feeding pitch of 9 μm (in the subscanning direction). In this case, it was possible to form images with uniform density without having any problem of fog and transfer-residue, under the conditions of exposure energy density of 160 $mJ/cm^2$ for yellow (Y), magenta (M) and cyan (C) and that of 140 $mJ/cm^2$ for black (K).

In addition, sample pieces were heated at 120° C. for 60 minutes and volatilized quantity of solvent per 1 $m^2$ was measured by the use of a gas chromatography, in which none of methyl ethyl ketone, cyclohexanone, toluene and i-propylalcohol were detected in both the recording material and the image receiving material.

Further, the image receiving material from which an image has been transferred was laminated on a printing paper (Mitsubishi special two-sided art paper 128 g/m) by a laminator available on the market (upper/lower rolls heating type) at 160° C., then the image receiving material was peeled off the printing paper, in which retransfer was performed perfectly together with an image receiving layer. Peeling was carried out at the interface between the image receiving layer and a peeling layer to form an image.

The reflection densities of Y, M, C and K of the resulting image were 1.50, 1.49, 1.52 and 1.65, respectively. The densities were measured through Macbeth RD918.

Example 1b

On the temporary support/image forming layer/light-heat converting layer prepared in Example 1a, there was coated continuously a cushion layer coated in Example 1a in the similar manner. It was laminated on a 100 μm-thick PET base (the same as above: T-100) immediately before being wound on a roll. After that, it was wound up on a roll. When unwinding this, the temporary support was peeled off the image forming layer at an interface between the temporary support and the image forming layer. Thus, a recording material which is quite free from scratches was obtained, similarly to Example 1a.

Using this material, transfer experiments were made, and the results of the experiments were the same as those in Example 1a.

Example 1c

On the temporary support (100-μm-thick PET base, the same as above: T-100) the releasing layer, the image forming layer and the light-heat converting layer in Example 1a was coated, and on this light-heat converting layer, there was coated continuously a cushion layer coated in Example 1a, and it was wound up. When unwinding this, the cushion layer was transferred onto the surface opposite to the releasing layer of the base together with the light-heat converting layer/image forming layer, thus, a recording material composed of a releasing layer/a support/a cushion layer/a light-heat converting layer/an image forming layer was obtained. In this case, the releasing layer serves as a BC layer to prevent blocking. No scratch was observed at all on the recording material obtained.

The results of experiments for transfer were the same as those in Example 1a.

Example 2

(Preparation of recording material)

A temporary support was prepared in a method wherein a releasing layer consisting of a fluorine-containing compound (made by Asahi Glass: LF200C) was wire-bar-coated on a 25-μm-thick PET base (the same as above: T-100) so that a thickness of dried coating is 0.5 μm, and then it was subjected to thermosetting. The recording material was prepared in the same manner as in Example 1, except that this temporary support was used. The thus obtained recording material was evaluated in the same manner as in Example 1. No residual solvent occurred as in Example 1, and when laser image transfer was conducted, neither fog nor insufficient image transfer was observed, and an excellent transfer image was obtained.

Example 3

(Preparation of recording material)

A temporary support was prepared in a method wherein a releasing layer solution having the following composition was diluted with water, then, it was coated by means of a wire bar method on a 25-μm-thick PET (the same as above: T-100) so that a thickness of dried coating may be 25 μm, and it was subjected to thermosetting at 100° C. for 10 minutes, and it was further subjected to curing at 60° C. for 36 hours.

After curing, this releasing layer is not decomposed even by hot water at 80° C., showing its water resistance. It is also resistant to solvents such as methyl ethyl ketone and cyclohexanone.

Releasing layer

The composite having the following solid matter rate (the rate of effective component in the case of a liquid) was diluted with water, and then was coated on a polyethylene terephthalate (PET) film in a way to get dry 0.3 g/$m^2$. After drying, it was subjected to heat treatment at 120° C. for 1 minute, and it was further subjected to curing at 60° C. for 36 hours.

| | |
|---|---|
| EG-30 (made by Nihon Gosei Kagaku: PVA) | 85 parts |
| Sumirez Resin 613 (made by Sumitomo Kagaku: cross-linking agent) | 9 parts |
| ACX-P (made by Sumitomo Kagaku: cross-linking accelerating agent) | 1 part |
| FP-150 (made by Sumitomo Kagaku: fluorine compounds) | 5 parts |

A recording material was prepared in the same manner as in Example 1, except that the resulting temporary support was used.

The recording material thus obtained was used for laser transfer, similarly to Example 1, and excellent images were obtained without any problem of fog and transfer-residue.

Example 4

(Preparation of recording material)

The recording material was prepared in the same manner as in Example 1, except that the composition of the releasing layer was changed to that shown below and was evaluated in the same manner as in Example 1a. The image forming layer was satisfactorily separated from the releasing layer, and the recording material showed the same sensitivity as that prepared in Example 1a.

Next, the following experiment was made, using the same releasing layer. Incidentally, ME810 in the composite is sparingly soluble in water and organic solvents.

Releasing layer

| | |
|---|---|
| Polyvinylalcohol (made by Nihon Gosei Kagaku: Gonsenol EG-30) | 50 parts |
| Fluorinated olefin dispersed substance (made by Daikin: ME810) | 50 PARTS |

Comparative Example 1

First, a coating solution for a light-heat converting layer used in Example 1a was wire-bar-coated on a 25-μm-thick PET (the same as above: T-100) in a way to get transmission absorption at 830 nm of 1.0.

Next, a cushion layer having the composition used in Example 1a was coated on a 50-μm-thick PET (the same as above: T-100) through a doctor coating method in a way to get a thickness of dried coating of 6 μm. The aforesaid cushion layer was caused to face the light-heat converting layer prepared previously in a device shown in FIG. 2, and both layers were caused to pass through a boundary between a heat roll and a silicone roll both in FIG. 2 to be laminated.

After the laminating, the 25-μm-thick PET was peeled off, and a sheet composed of PET/a cushion layer/a light-heat converting layer was obtained. Further, on this light-heat converting layer, an image forming layer used in Example 1a was wire-bar-coated. After drying, it was wound up to obtain a recording material, and cracks were observed on the surface of the image forming layer and scratches were also observed sporadically.

Using this recording material, exposure identical to that in Example 1 a was conducted, but a non-transferred image was observed on the place of cracks, and imperfect transfer was observed over a wide area of the place where scratches occurred, resulting in inability to obtain good images.

In addition, a piece of the material was heated at 120° C. for 60 minutes, and a volatile solvent quantity per $m^2$ of the material was measured according to gas chromatography. The residual amount of methyl ethyl ketone and cyclohexanone, each being a solvent for the image forming layer, was 5.6 mg/$m^2$ and 5.2 mg/$m^2$, respectively.

Comparative Example 2

A recording material was prepared in the same manner as in Example 1a except that a releasing layer composition was changed to methylcellulose (made by Sumitomo Kagaku: SM-15). Methylcellulose is resistant to solvents (methyl ethyl ketone and cyclohexanone) for coating an image forming layer, but it is not resistant to solvents (water and alcohol) for coating a light-heat converting layer.

When this releasing layer was used, the releasing layer was dissolved slightly when coating a light-heat converting layer, and thereby the adhesion force between an image forming layer and the releasing layer was undesirably increased, resulting in difficulty of releasing at an interface between the image forming layer and the releasing layer (the light-heat converting layer alone was transferred onto the cushion layer, and the image forming layer remained on the releasing layer).

Comparative Example 3

An example was made in the same manner as in Example 1a except that a silicone type releasing agent (made by Toshiba Silicone: TPR6702) was used for the releasing layer. It was finally possible to transfer both the image forming layer and the light-heat converting layer simultaneously onto the side of the cushion layer, but sensitivity of the recording material was lowered to 200 mJ/cm$^2$. This was caused by the silicone type releasing agent which moved to the surface of the image forming layer to retard a thermal image transfer.

What is claimed is:

1. A method of manufacturing a light-heat converting heat mode recording material comprising a support having thereon a cushion layer, an intermediate layer and an image forming layer in that order, the material comprising a light-heat converting substance, the method comprising the steps of:

a) providing a first unit comprising a first support;

b) providing a second unit comprising a second support having thereon the image forming layer, the intermediate layer and the cushion layer in that order, a releasing layer being provided between the second support and the image forming layer;

c) superposing the second unit on the first unit so that the image forming layer side is in close contact with the first support of the first unit; and d) separating the second support from the image forming layer to form the recording material, wherein the releasing layer contains a cross-linked compound, the releasing layer is insoluble in a coating solvent for both the intermediate layer and the image forming layer, or the releasing layer contains a fluorine-containing compound or a long chain alkyl group-containing compound.

2. The method of claim 1, wherein the cushion layer has a coefficient of elasticity of not more than 100 kg/cm$^2$ at 20° C. and a penetration of not less than 20.

3. The method of claim 1, wherein the intermediate layer is a light heat converting layer which has an optical density of 0.3 to 3.0 in a recording light wavelength and comprises a light-heat converting substance in an amount of 2 to 80 weight %, the light-heat converting substance being selected from the group consisting of carbon black, graphite, colloid silver, a cyanine, polymethine, azulenium, squalenium, thiopyrylium, naphthoquinone or anthraquinone dye and a phthalocyanine, azo, or thioamide metal complex.

4. The method of claim 1, wherein the image forming layer comprises pigment and a binder.

5. The method of claim 1, wherein the long chain alkyl group-containing compound is selected from the group consisting of liquid paraffin and an alkyl benzene wherein the alkyl is a straight-chained alkyl having 10 to 13 carbon atom.

6. A method of manufacturing a light heat converting heat mode recording material comprising a support having thereon, a cushion layer, an intermediate layer and an image forming layer in that order, the material comprising a light-heat converting substance, the method comprising the steps of:

a) forming the image forming layer, the intermediate layer, the cushion layer on one side of the support in that order, a releasing layer being provided between the support and the image forming layer;

b) separating the cushion layer, the intermediate layer, and the image forming layer altogether from the one side of the support; and then c) transferring the cushion layer, the intermediate layer and the image forming layer to the opposite side of the support to form the recording material, wherein the releasing layer contains a cross-linked compound, the releasing layer is insoluble in a coating solvent for both the intermediate layer and the image forming layer, or the releasing layer contains a fluorine-containing compound or a long chain alkyl group-containing compound.

7. A method of forming a thermal transfer image using a light heat converting heat mode recording material comprising a second support and provided thereon, a cushion layer, an intermediate layer, an image forming layer and a first support in that order, a releasing layer being provided between the first support and the image forming layer and the intermediate layer comprising a light heat converting layer, the method comprising the steps of:

a) separating the first support from the recording material;

b) bringing the image forming layer of the resulting material in close contact with an image receiving layer of an image receiving material;

c) imagewise exposing the resulting material from the second support side to form an image; and then d) transferring the image to the image receiving layer, wherein the releasing layer contains a cross-linked compound, the releasing layer is insoluble in a coating solvent for both the intermediate layer and the image forming layer, or the releasing layer contains a fluorine-containing compound or a long chain alkyl group-containing compound.

* * * * *